United States Patent [19]

Phillips, II

[11] Patent Number: 5,266,052
[45] Date of Patent: Nov. 30, 1993

[54] CIRCUIT BOARD HOLD-DOWN FASTENER

[75] Inventor: Ronald W. Phillips, II, Sellersville, Pa.

[73] Assignee: Penn Engineering & Manufacturing Corp., Danboro, Pa.

[21] Appl. No.: 969,394

[22] Filed: Oct. 29, 1992

[51] Int. Cl.5 ............................................. H01R 13/73
[52] U.S. Cl. .................................... 439/562; 411/502
[58] Field of Search ............... 439/562, 564, 565, 571, 439/82; 29/738; 411/15, 41, 501, 502

[56] References Cited

U.S. PATENT DOCUMENTS

| | | | |
|---|---|---|---|
| 2,751,809 | 6/1956 | Barker | 411/15 |
| 2,956,468 | 10/1960 | Macy | 411/41 |
| 4,405,272 | 9/1983 | Wollar | 411/41 |

FOREIGN PATENT DOCUMENTS 0010055  4/1980  European Pat. Off. ............ 439/564

*Primary Examiner*—Eugene F. Desmond
*Attorney, Agent, or Firm*—Gregory J. Gore

[57] ABSTRACT

A circuit board fastener includes a tubular shank and a slideable expander pin which is pressed into a bore in the shank. A flange at the top seats the fastener against the member to be joined to the circuit board. The pin has an interference fit and remains within the bore, which is convergent at the bottom end of the fastener. When the expander pin is driven into the convergent bottom end of the bore, it expands that end of the shank to grip the inner wall of the circuit board aperture. The pin is moved by a simple pressing force into the bore, which is applied by a tool from above to install the fastener to the circuit board, or from below to disengage the fastener from the circuit board. The two-part fastener may be constructed from a unitary part which may be conveniently broken into the two mating components and assembled in one motion. In this latter case, a frangible collar between the expander pin and the top of the flange is broken by a compressive force which separates the parts and drives the pin into the bore.

13 Claims, 2 Drawing Sheets

CIRCUIT BOARD HOLD-DOWN FASTENER

FIELD OF THE INVENTION

This invention relates to fasteners which join two panels or members to panels, such as electronic components to circuit boards. More specifically, this invention relates to an electrical connector assembly which facilitates the final assembly of printed circuit boards by way of low insertion force component positioning from the top side of the circuit board.

BACKGROUND OF THE INVENTION AND PRIOR ART

The assembly of components, such as connectors and other electronic devices, onto circuit boards requires a highly specialized assembly procedure. Typically, connectors are secured to circuit boards by a connector housing which is fastened to the circuit board through aligned apertures by the use of a fastener. In the past, rivets, screws and solderable eyelets have all been used to secure connectors to the printed circuit board. A particular component to which the present invention is suitably applied is called a "D-sub-connector".

As the need for faster assembly rates continues, there is required in the art means for economically and quickly securing the connector housings to the circuit boards. To achieve greater economy and speed, certain objectives are desired; namely, a connector which can be inserted into the circuit board with an extremely low insertion force, a connector with fastening means which may be actuated from the top side of the circuit board, a connector with fastening means which does not require special tooling on the underside of the circuit board, and a connector with fastening means which may be actuated and released quickly with low actuation force. Rivets are inadequate because they require a high actuation force and tooling both above and below the circuit board. Screws and solderable eyelets are objectionable because they are time-consuming and labor intensive.

Various fasteners have been devised in an attempt to meet the objectives described above. U.S. Pat. No. 4,939,406 issued to Jeschonneck et al on Jul. 3, 1990 shows a housing fastener which is secured to a panel, gripping the inner wall of an aperture in the panel by an expanding sleeve. U.S. Pat. No. 4,717,219 issued to Frantz et al on Jan. 5, 1988 shows a housing connector which may be secured to a circuit board by using an expandable eyelet. With the Frantz et al device, the inner wall of the circuit board aperture is gripped by the expanding shank of the eyelet which is splayed apart by an actuation tool.

With both of these devices, however, there are drawbacks to circuit board assembly. For example, the Jeschonneck et al housing fastener is a complicated device which is slow to actuate. The Frantz et al device suffers in that it cannot be used with circuit boards of varying thickness and there is often a problem with solder wicking in the bore of the fastener through the slots. This fastener also requires that the flared bottom end project beyond the board thickness which can present an obstruction to other structures mounted on the opposite side of the board.

SUMMARY OF THE INVENTION

The present invention is a vastly improved fastener for joining planar members which may be particularly useful in fulfilling the needs of the circuit board assembly arts described above. The fastener includes a tubular shank and a slideable expander pin which is pressed into a bore in the shank. A flange at the top seats the fastener against the member to be joined to the circuit board. The pin has a frictional interference fit and remains within the bore, which is convergent at the bottom end of the fastener. The expander pin slides within the bore and when driven into the convergent bottom end of the bore expands that end of the shank to grip the wall of the circuit board aperture. The pin is moved by a simple pressing force into the bore which is applied by a tool from above to actuate, or from below to disengage.

In order to make the present invention more effective, locking teeth may be added around the outside of the shank at the bottom end to provide a positive grip by biting into the circuit board. The pin may further include a head which limits the travel of the pin and also permits the pin to be removed by a pulling force from above, rather than being pushed from below. The fastener is preferably composed of a resilient material so that it may be used and reused many times if needed.

The present invention is a two-part fastener, however, it can be economically made from a unitary part which may be conveniently broken into two mating components and assembled in one motion. In the manufacturing process, both parts of the fastener are formed of one piece of material. The expander pin is formed from an extension of metal which projects from the top of the fastener above the flange, but there lies between the pin and the flange a very thin wall of metal which creates a frangible collar therebetween. A single compressive force breaks the two elements of the fastener apart and drives the pin into the bore. Thereby, the application of a single driving force creates and assembles a two-part fastener from a unitary part.

In circuit board applications, it is desired to keep forces on both the electronic device and the circuit board to a minimum. Therefore, the pin is preferably preset by preliminary compression at high force after production, but before assembly. In this case, the expander pin is broken away, but driven only part way down the bore, being left at the top of the bore substantially flush with the top of the flange. Prior to circuit board assembly, the preset fastener is preassembled into a housing or other electrical device. This is accomplished by pressing the fastener into the mounting aperture of the device until the flange at the top of the fastener bottoms out. Broaching splines along the outside of the shank bite into the inner wall of the housing aperture, thereby providing attachment between the device and the fastener. After the electronic device with the attached fastener has been placed on the circuit board, the expander pin on each fastener is driven farther into the bore at low force, expanding the bottom end of the fastener into the inner wall of the circuit board aperture. Thus, the device is secured to the circuit board without damage to either the top or bottom faces of the board.

More specifically, the applicant has devised a fastener for uniting first and second planar members, comprising: a breakaway expander pin extending from a first end of the fastener; a flange adjacent the pin, the flange having a diameter greater than all other portions of the fastener; a frangible collar between the pin and flange; a tubular shank on the opposite side of the flange extending away from the pin; a plurality of broaching splines extending axially along a central portion of the outside of the shank; an internal bore within the shank extending from the frangible collar through a second end of the fastener, the bore having a portion in the area of the second end which is convergent toward the second end; and the fastener being a unitary structure which is broken into two mating parts by the application of a single axial compressive force which breaks the pin away from the flange in the area of the frangible collar and then drives the pin into the bore, whereby the application of the single driving force creates an assembled two-part fastener from a unitary part.

When the pin is driven into the bore, the pin is then slideably and frictionally engaged in the bore. When the pin is driven yet farther into the convergent portion of the bore, the wedging action of the pin radially expands the second end of the fastener. First and second planar members are united by the fastener being inserted through aligned apertures in the members and the expander pin being driven fully to the second end. The broaching splines firmly attach the fastener to the first member, while the second end of the fastener is secured to the second member by the expansion of the second end of the fastener against an inner wall of the aperture of the second member. Locking teeth extend radially from the second end of the fastener and embed into the inner wall of said second member upon actuation. After insertion, the termination of the second end of said fastener lies within the aperture of the second planar member and does not project beyond the opposite side of the second member.

The present fastener is preferably composed of a resilient material. Hence, removal of the expander pin along the internal bore in the direction of the first end of the fastener permits the second end of the fastener to contract, returning to its free state, thus releasing the locking teeth from engagement with the second member. A head may be included at the top of the pin to limit the travel of the pin into the bore at the point when the pin is fully inserted. The assembly further includes a shoulder on the underside of the head, the shoulder having a diameter smaller than the head, whereby the head is held a distance from the flange when the pin is fully inserted.

The expander pin remains within the fastener bore at all times and this and other features satisfy the above-mentioned objectives and provide many advantages over the prior art. For example, the expander pin provides a direct mechanical wedge which forces and holds the expanded shank jaws into the inner wall of the circuit board without need for the resilience of the shank material to supply gripping force. Secondly, because the expander pin fills the bore in the bottom end of the fastener, solder is prevented from wicking in the bore. Thirdly, the flaring action of the expander pin occurs at a point along the shank within the circuit board, thus providing a grip in any thickness of circuit board. Also, the fastener does not project beyond the board thickness, thus permitting shielding or other structures to be mounted behind the board without obstruction. Finally, the fastener is easily removed and reused by pushing or pulling the expander pin back out of the convergent bottom end of the bore.

The above-described fastener provides a significant improvement over the prior art and achieves the objectives of a low insertion force, low actuation force circuit board fastener which may be quickly engaged by top actuation and which can be easily removed and reused. It also provides the other advantages described above.

More advantages will be apparent to those of skill in the art from the following drawings and description of the preferred embodiments.

DESCRIPTION OF THE PREFERRED EMBODIMENT

Figure 1:
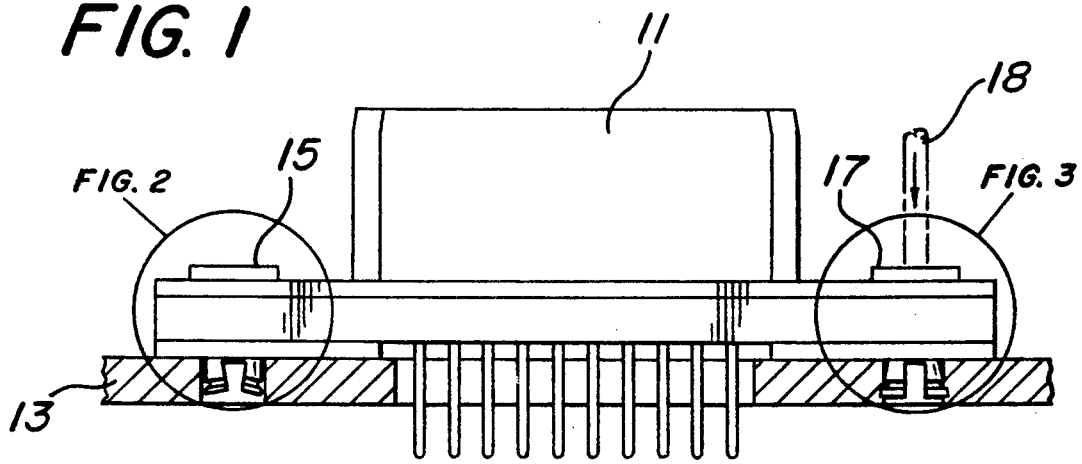
FIG. 1 is a front view of the present invention inserted between a semiconductor device mounted on a circuit board. The two fasteners shown in this figure depict both actuated and unactuated states.

The present invention is a fastener which may be used generally between any flat panels, but is most effective for mounting electrical devices to circuit boards. Referring to FIG. 1, electrical device 11 is shown inserted into circuit board 13 by the fasteners 15 and 17 of the present invention. In this figure, fastener 15 is shown in its preset, disengaged state and fastener 17 is shown being actuated by tool 18.

Figure 5:
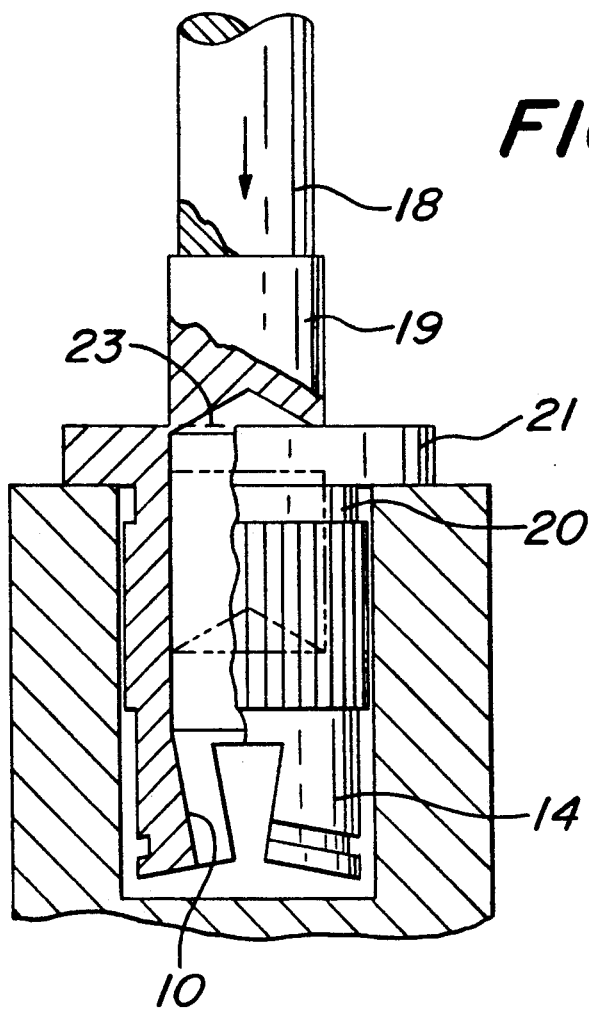
FIG. 5 is a front sectional view of the present invention as manufactured and with the preset position of the expander pin shown in phantom.

Referring now to FIG. 5, both unaltered and preset states of the present invention are shown. As manufactured, expander pin 19 exists as an extension of the fastener material extending from the top of the flange 21. The fastener is preferably formed from #303 or #416 stainless steel. Between the flange and the expander pin lies a thin wall of material, approximately 0.002-0.016 inches thick, creating a frangible collar 23. Tubular shank 20 includes a central axial bore which begins at the top of the flange and continues through the opposite end of the fastener. The bottom end of the fastener includes tapered inner walls 10. Slots in the end of the tubular shank create opposing jaws 14. As shown in phantom in this figure, the expander pin has been pressed downward by tool 18 and has broken away from the top of the flange in the area of the frangible collar. The compression force required to break the collar is approximately 200-400 lbs.

Figure 3:
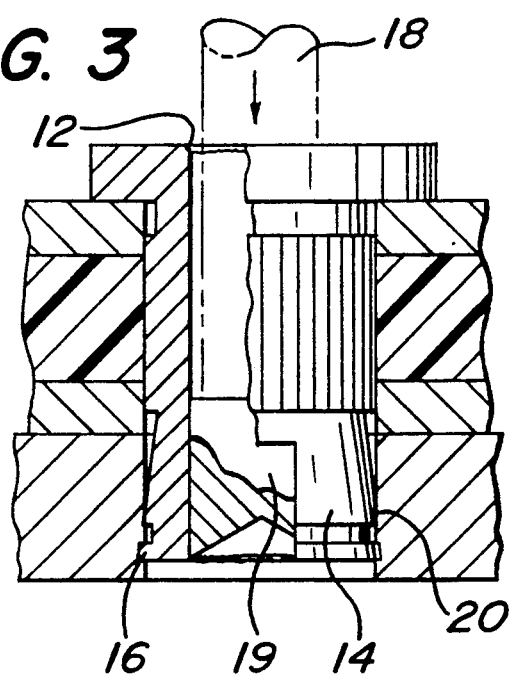
FIG. 3 is a front sectional view of the present invention shown in its actuated state.
Figure 2:
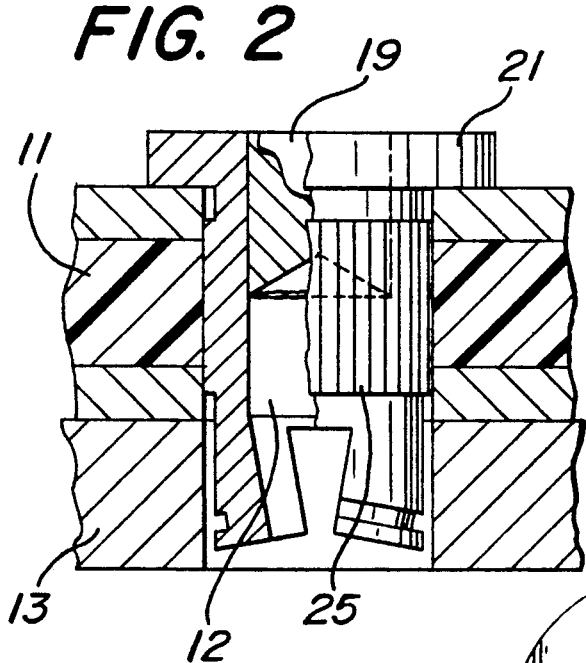
FIG. 2 is a front sectional view of the present invention shown in its unactuated state.

As mentioned above, it is preferable in the circuit board arts to keep all forces on the circuit board as low as possible. It is, therefore, desirable to have the fastener preset with the frangible collar broken and the expander pin left in the bore, flush with the top of the flange as shown in FIG. 2. Later, after the fastener has been affixed to the electronic device and inserted into the board as shown in FIG. 3, the expander pin may then be moved farther downward into its locking position. The actuation force required after the fastener is preset is only 20 lbs. This force is one-tenth of the initial breakaway compression force of the pin, and this low actuation force will not damage either the circuit board or the electronic device.

As shown in FIG. 2, the electrical device housing 11 is mounted directly atop circuit board 13 and the fastener is preset and shown fully inserted into the electrical device, but not actuated. Broaching splines 25 cut into the electrical device and firmly attach the fastener shank to that component. In this figure, expander pin 19 has been driven part way down bore 12 to a point where the top of the pin is flush with the top of the flange 21.

Referring now to FIG. 3, the fastener has been assembled like the fastener of FIG. 2, but has been actuated. The compression force exerted by tool 18 drives the pin 19 downward into the bottom end of bore 12. When the pin reaches the bottom of the bore, it mechanically wedges into the convergent end of the shank, thereby spreading jaws 14 against the inner wall of the aperture in the circuit board. In the preferred embodiment, the jaws include teeth 16 which bite into the circuit board material to provide a positive grip. It can be seen from FIGS. 2 and 3 that the end of the fastener does not project beyond the opposite face of the board and, therefore, will not interfere with structures on that opposite side. Hence, this fastener may be used with any board thickness. Furthermore, no special tooling is required beneath the board to actuate the fastener.

Figure 4:
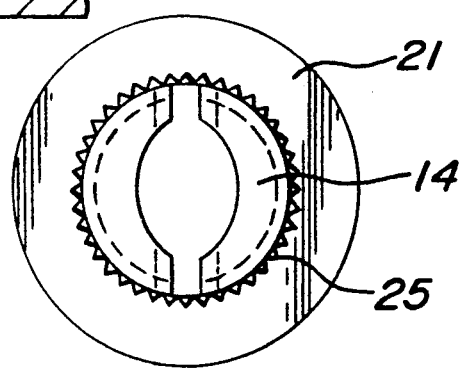
FIG. 4 is a top view of the present invention.

Referring now to FIG. 4, a bottom view of the present device is shown. In its free state, jaws 14 lie within the outer diameter of the shank which is greatest in the area of the broaching splines 25. Flange 21 extends beyond the greatest diameter of the shank.

Figure 6:
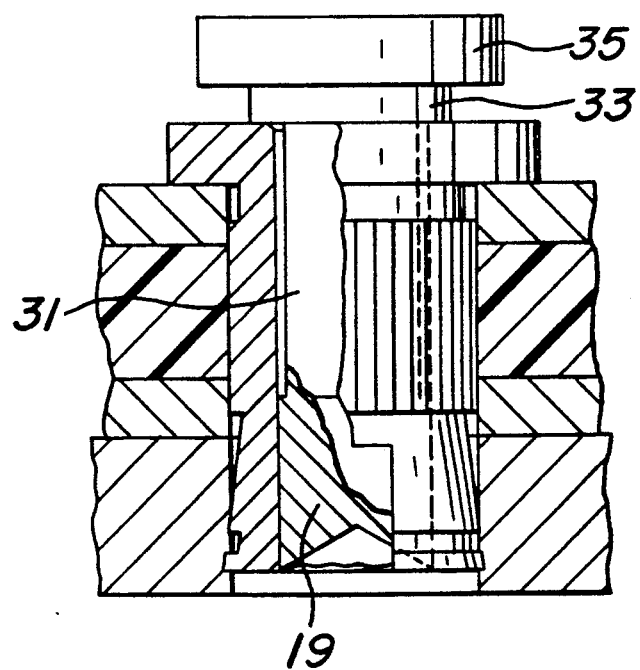
FIG. 6 is a front sectional view of an alternate embodiment of the present invention.

Referring to FIG. 6, an alternate embodiment of the present invention is shown. In this embodiment, the expander pin 19 includes an elongate shaft 31 and further includes a shoulder 33 with a head 35. The addition of these structures permits the expander pin 19 to be pulled upward by a suitable tool which engages the underside of the head to withdraw the pin and release the fastener. The pin may be moved downward by pushing on the head with the shoulder bottoming against the flange at the point when the expander pin is fully inserted. The advantages of this embodiment are that the expander pin cannot be overdriven and the fastener may be disengaged from the top of the board. Otherwise, it would be necessary to push the pin upward by a tool inserted into the bore from the underside of the circuit board. The other structures shown in this figure are identical to those presented in FIG. 3.

In circuit board applications, there are four steps to employing the present invention. First, the expander pin is preset (FIG. 5); that is, it is broken away by compression and inserted part way down the fastener bore, short of actuating the jaws at the lower end of the fastener. Second, the preset fastener is inserted into the electrical device prior to circuit board mounting (FIG. 2). This is accomplished by pressing the fastener into a suitably dimensioned aperture in an electronic device so that the broaching splines of the fastener cut into the material of the electronic device housing so that the fastener becomes firmly affixed to the device. Third, the preassembled device and fastener may then be moved to the area of the circuit board and placed on the circuit board. The apertures in the circuit board are dimensioned greater than the nominal diameter of the fastener so that the assembly may be placed into the circuit board apertures with zero insertion force (FIG. 2). Finally, by use of an insertion tool, the expander pin is pushed downward through the shank bore into the bottom end of the fastener where it spreads apart the jaws which bite into the circuit board material (FIG. 3). Thus, the electronic device is joined firmly to the circuit board.

It will therefore be readily seen that the above-described fastener meets the objectives of a zero insertion force assembly with a low actuating force circuit board hold-down fastener. A critical feature of this device is the breakaway expander pin which provides great economies of manufacture in that the two-part device is formed from only one piece of material. Further economies are achieved because a single compressive force creates the mating parts and assembles them in only one motion. This makes the present invention economically feasible for use in circuit board assembly.

It should be understood that the above description discloses specific embodiments of the present invention and are for purposes of illustration only. There may be other modifications and changes obvious to those of ordinary skill in the art which fall within the scope of the present invention which should be limited only by the following claims and their equivalents.

What is claimed is:

1. A fastener for uniting first and second planar members, comprising:
   a breakaway expander pin extending from a first end of the fastener;
   a flange adjacent said pin, said flange having a diameter greater than all other portions of the fastener;
   a frangible collar between said pin and said flange;
   a tubular shank on the opposite side of said flange extending away from said pin;
   an internal bore within said shank extending from said frangible collar through a second end of the fastener, said bore having a portion in the area of the second end which is convergent toward the second end; and
   said fastener being a unitary structure which is broken into two mating parts by the application of a single axial compressive force which breaks said pin away from said flange in the area of said frangible collar and then drives the pin into said bore, whereby the application of the single driving force creates an assembled two-part fastener from a unitary part,
   said fastener being composed of a resilient material, whereby removal of said expander pin along said internal bore in the direction of said first end of said fastener causes the second end of said fastener to contract.

2. The fastener of claim 1, further described in that when said force drives the pin into said bore, said pin is then slideably and frictionally engaged in said bore and when the pin is driven farther into said convergent portion of said bore, said pin axially expands the second end of the fastener.

3. The fastener of claim 2, further including first and second planar members united by said fastener creating an assembly, said fastener being inserted between said planar members in face-to-face abutment through aligned apertures in said members, said first member and said second end of the fastener secured to the second member by the expansion of the second end of the fastener against an inner wall of the aperture of the second member.

4. The assembly of claim 3, further including a plurality of broaching splines extending axially along a central portion of the outside of said shank firmly attaching said fastener to said first member.

5. The assembly of claim 4, further including locking teeth which extend radially from the second end of said fastener, said teeth being embedded into the inner wall of said second member.

6. The assembly of claim 5, wherein the termination of the second end of said fastener lies within the aperture of the second planar member.

7. The assembly of claim 1, further including a head at the end of said pin which limits the travel of said pin into said bore at the point when the pin is fully inserted.

8. The assembly of claim 7, further including a shoulder on the underside of said head, said shoulder having a diameter smaller than said head, whereby a portion of the underside of said head is held a distance from said flange when the pin is fully inserted.

9. The assembly of claim 8, further described in that the second end of said shank is slotted and further includes opposing jaws.

10. The assembly of claim 9, wherein said fastener is composed of steel.

11. The assembly of claim 10, wherein said first member is an electrical component.

12. The assembly of claim 11, wherein said second member is a circuit board.

13. A hold-down fastener for securing electrical components to a circuit board, comprising:
- a circuit board;
- a flange at the top of the fastener in abutment with front side of the circuit board;
- a tubular shank, extending immediately downward from said flange;
- an axial through-bore, a portion of said bore at the bottom end of the fastener being convergent toward the bottom end;
- an expander pin slideable within said bore between a position of disengagement in the top of the bore and a position of actuation when it is moved into the convergent bottom portion of the bore, whereby said fastener becomes secured to said circuit board by the axial expansion of the bottom end of the fastener when the pin is driven into said convergent portion of said bore;
- said fastener being composed of a resilient metal, whereby movement of said expander pin into the disengagement position within the internal bore permits the bottom end of said fastener to contract, thus non-destructively releasing said fastener from engagement with said circuit board; and
- said fastener further described in that the length of said shank is shorter than the width of the circuit board such that the bottom end of said fastener does not project beyond the back side of the circuit board when engaged.

* * * * *